United States Patent
Chung et al.

(10) Patent No.: US 7,495,388 B2
(45) Date of Patent: Feb. 24, 2009

(54) DISPLAY DEVICE, AND METHOD OF MANUFACTURING THE DISPLAY DEVICE

(75) Inventors: Jin-Koo Chung, Suwon-si (KR); Joon-Hoo Choi, Seoul (KR); Dong-Won Lee, Seongnam-si (KR)

(73) Assignee: Samsung Electronics Co., Ltd. (KR)

( * ) Notice: Subject to any disclaimer, the term of this patent is extended or adjusted under 35 U.S.C. 154(b) by 226 days.

(21) Appl. No.: 10/523,984

(22) PCT Filed: Dec. 24, 2004

(86) PCT No.: PCT/KR2004/003430

§ 371 (c)(1),
(2), (4) Date: Feb. 8, 2005

(87) PCT Pub. No.: WO02/089211

PCT Pub. Date: Nov. 7, 2002

(65) Prior Publication Data

US 2005/0264177 A1 Dec. 1, 2005

(30) Foreign Application Priority Data

Jan. 8, 2004 (KR) .................. 10-2004-0001322
Feb. 9, 2004 (KR) .................. 10-2004-0008414

(51) Int. Cl.
*H01J 1/62* (2006.01)
*H01J 63/04* (2006.01)

(52) U.S. Cl. ............... 313/506; 313/509; 313/504

(58) Field of Classification Search ......... 313/495–312; 315/169.3; 257/40, 79; 428/690
See application file for complete search history.

(56) References Cited

U.S. PATENT DOCUMENTS

| | | | | |
|---|---|---|---|---|
| 5,332,946 A * | 7/1994 | Eckersley et al. | ......... | 313/506 |
| 6,037,712 A * | 3/2000 | Codama et al. | ......... | 313/498 |
| 6,137,220 A * | 10/2000 | Nagayama et al. | ......... | 313/504 |
| 6,380,672 B1 * | 4/2002 | Yudasaka | ......... | 313/504 |
| 6,833,668 B1 * | 12/2004 | Yamada et al. | ......... | 313/505 |
| 7,053,548 B2 * | 5/2006 | Nakanishi | ......... | 313/506 |
| 7,053,549 B2 * | 5/2006 | Omura et al. | ......... | 313/512 |
| 2003/0111957 A1 * | 6/2003 | Kim et al. | ......... | 313/609 |
| 2004/0070808 A1 * | 4/2004 | Nakanishi | ......... | 359/245 |
| 2004/0169464 A1 * | 9/2004 | Birnstock et al. | ......... | 313/504 |

(Continued)

FOREIGN PATENT DOCUMENTS

EP   1 367 647 A2   12/2003

(Continued)

*Primary Examiner*—Peter Macchiarolo
(74) *Attorney, Agent, or Firm*—Cantor Colburn LLP

(57) ABSTRACT

A display device and a method of manufacturing the display device include a substrate having a first region and a second region disposed at a peripheral portion of the first region. The substrate includes a plurality of first electrodes disposed on the first region and an insulation member selectively disposed in the first region. The insulating member has a plurality of openings which expose a portion corresponding to the first electrodes. The substrate includes light emitting patterns disposed on the first electrodes through the openings and the substrate has a second electrode disposed on the light emitting patterns. Accordingly, the thickness of the light emitting patterns is uniform so that the quality of an image generated from the light emitting patterns is improved.

23 Claims, 20 Drawing Sheets

U.S. PATENT DOCUMENTS

2004/0263072 A1* 12/2004 Park et al. ................... 313/509
2006/0033429 A1* 2/2006 Fujimura et al. ............ 313/509
2006/0182996 A1* 8/2006 Nakamura et al. .......... 428/690

FOREIGN PATENT DOCUMENTS

GB 2 106317 A 4/1983
WO WO 02/089211 A1 11/2002

* cited by examiner

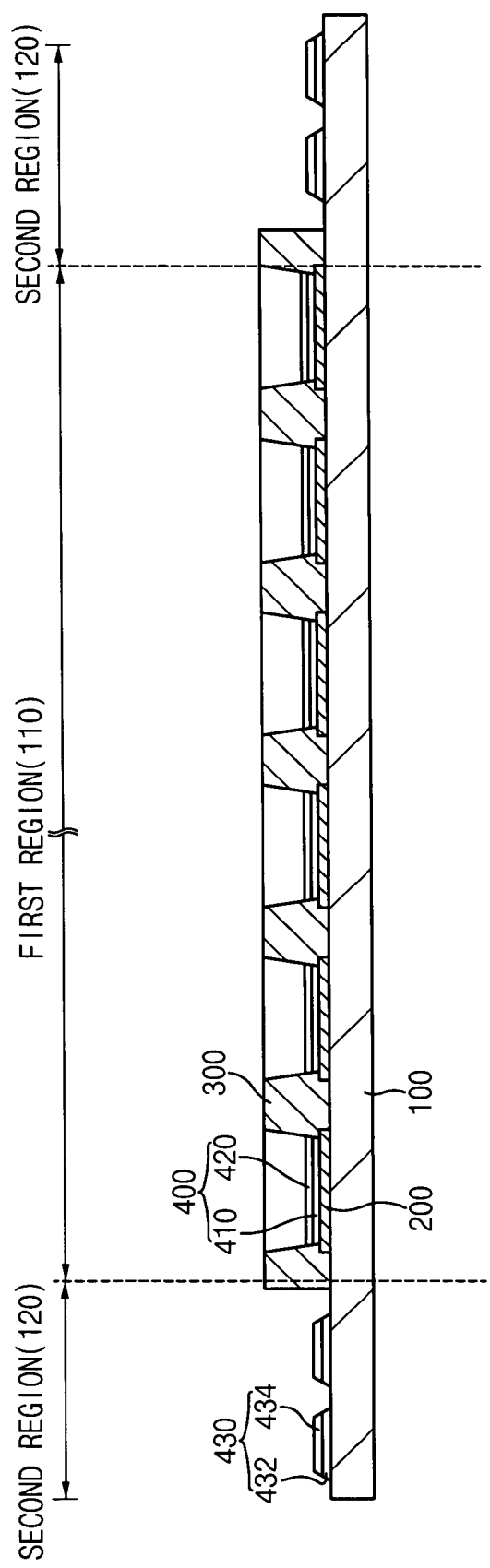

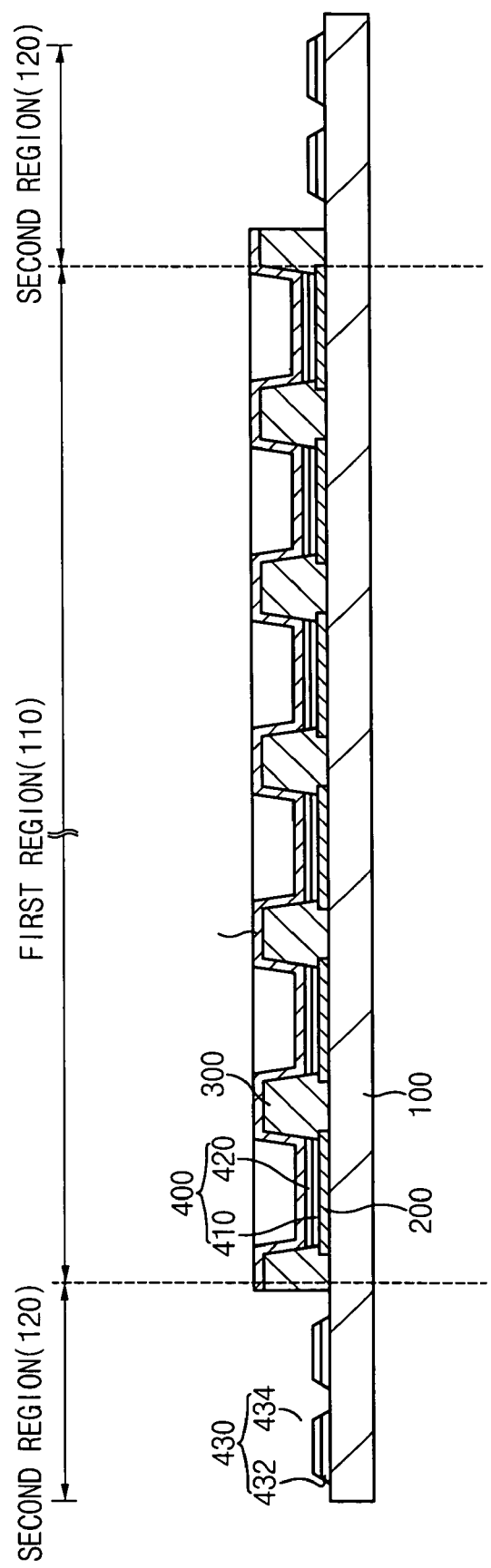

DISPLAY DEVICE, AND METHOD OF MANUFACTURING THE DISPLAY DEVICE

TECHNICAL FIELD

The present invention relates to a display device and a method of manufacturing the display device. More particularly, the present invention relates to a display device with enhanced display quality and a method of manufacturing the display device.

BACKGROUND ART

Generally, a display device operates as an interface device that converts data generated by an information-processing device into an image.

The display device includes a cathode ray tube (CRT) display device, a liquid crystal display (LCD) device, an organic electro luminescent (EL) device, a plasma display panel (PDP) device etc. The CRT display device displays an image by controlling electron beams irradiated onto the fluorescent layer of the CRT screen. The LCD device displays an image using liquid crystal. The EL device displays an image through an organic light emitting layer that emits by a current supplied to the organic light emitting layer. The PDP displays an image by plasma.

The organic EL device has merits such as a lightweight, a small thickness, a high brightness, an excellent color-reappearance, a fast response speed, a capability of displaying a full color image, a low power consumption, a wide range of operational temperature, a low manufacturing cost in comparison with other display devices such as the LCD device.

The organic EL device includes anode electrodes, an organic layer, organic light emitting patterns, and a cathode electrode. The anode electrodes are disposed on a substrate in a matrix configuration, the organic layer is disposed on the substrate, and the organic layer has an opening that exposes the anode electrodes. The organic light-emitting patterns are disposed on the anode electrodes and emit light. The cathode electrode is disposed on the organic light-emitting patterns.

Conventional organic light-emitting patterns of the organic EL device have a multiple-layered structure. For example, the organic light-emitting patterns have a hole injection layer (HIL), an emission material layer (EML) formed on the HIL, and an electron injection layer (EIL) formed on the EIL.

The organic light-emitting patterns may be formed by various apparatus such as a slit mask processing apparatus, a spin coating processing apparatus, a vacuum deposition processing apparatus etc. Recently, the organic light-emitting patterns are formed by an ink-jet type drop filling device.

In forming the organic light-emitting patterns on the substrate, a speed of drying an organic light-emitting material of the organic light-emitting patterns is very important.

Generally, the organic light-emitting material includes a volatile solvent. When the light-emitting patterns is formed on the substrate by the ink-jet type drop filling device, the thickness of the organic light emitting-patterns are affected by the speed of drying the organic light emitting material. When the speed of drying the organic light emitting materials is locally different, the thickness of the organic light emitting-patterns may not be uniformly controlled so that a brightness uniformity of lights generated from the organic light emitting-patterns may not be uniformly controlled.

In order to overcome this problem, the droplet including organic material is formed on a non-effective display region disposed on an organic layer of the substrate as well as an effective display region, thereby forming dummy organic light-emitting patterns on the non-effective display region. The dummy organic light-emitting patterns adjust the speed of drying the organic light-emitting patterns formed on the effective display region.

However, the dummy organic light-emitting patterns disposed in the non-display region of the organic layer have a position higher than that of the organic light-emitting patterns in the display region by a thickness difference between the anode electrode and the organic layer. Therefore, a dummy organic material for forming the dummy organic light-emitting patters flows into the opening of the display region.

When the dummy organic material flows into the opening, the thickness of the organic light-emitting patters may not be controlled, so that the display quality of the image may be deteriorated.

DISCLOSURE OF THE INVENTION

Technical Problem

Accordingly, the present invention is provided to substantially obviate one or more problems due to limitations and disadvantages of the related art.

It is a feature of the present invention to provide a display device improving a display quality of an image.

It is another feature of the present invention to provide a method of manufacturing of the display device.

Technical Solution

In accordance with one aspect of the present invention, a display device includes a substrate, a plurality of first electrodes, an insulation member, a light emitting patterns and second electrodes. The substrate has a first region and a second region disposed at a peripheral portion of the first region. The plurality of first electrodes is disposed on the first region. The insulation member is selectively disposed in the first region and the insulation member has a plurality of openings that expose a portion corresponding to the first electrodes, respectively. The light emitting patterns is disposed on the first electrodes through the openings, respectively. The second electrode is disposed on the light emitting patterns.

In accordance with another aspect of the present invention, there is provided a method of manufacturing a display device. In the method, a plurality of first electrodes is formed on a first region formed on the substrate. An insulating layer formed on the first region and the insulating layer has openings so as to expose to the first electrodes. A plurality of light emitting patterns is formed on the first electrodes, respectively, and a second electrode formed on the first region to cover the light emitting patterns.

According to the present invention, a display device includes a first electrodes formed on the first region of a substrate in a matrix configuration. An organic insulating layer formed on the second region formed around the first region and the organic insulating layer has an openings corresponding to the first electrodes. A plurality of organic light emitting patterns is formed on the first electrodes for emitting a light. A second electrode is formed on the organic light emitting patterns. Thus, the lights generated from the organic light emitting patterns have uniformity brightness so that the quality of the image is improved.

BRIEF DESCRIPTION OF THE DRAWINGS

The above and other features and advantage points of the present invention will become more apparent by describing in detailed exemplary embodiments thereof with reference to the accompanying drawings, in which:

FIGS. 10 to 20 are cross-sectional views and plan views illustrating a method of manufacturing a display device in accordance with still another embodiment of the present invention.

BEST MODE FOR CARRYING OUT THE INVENTION

The present invention now will be described more fully hereinafter with reference to the accompanying drawings, in which embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. Like numbers refer to similar or identical elements throughout.

Display Device

Figure 1:
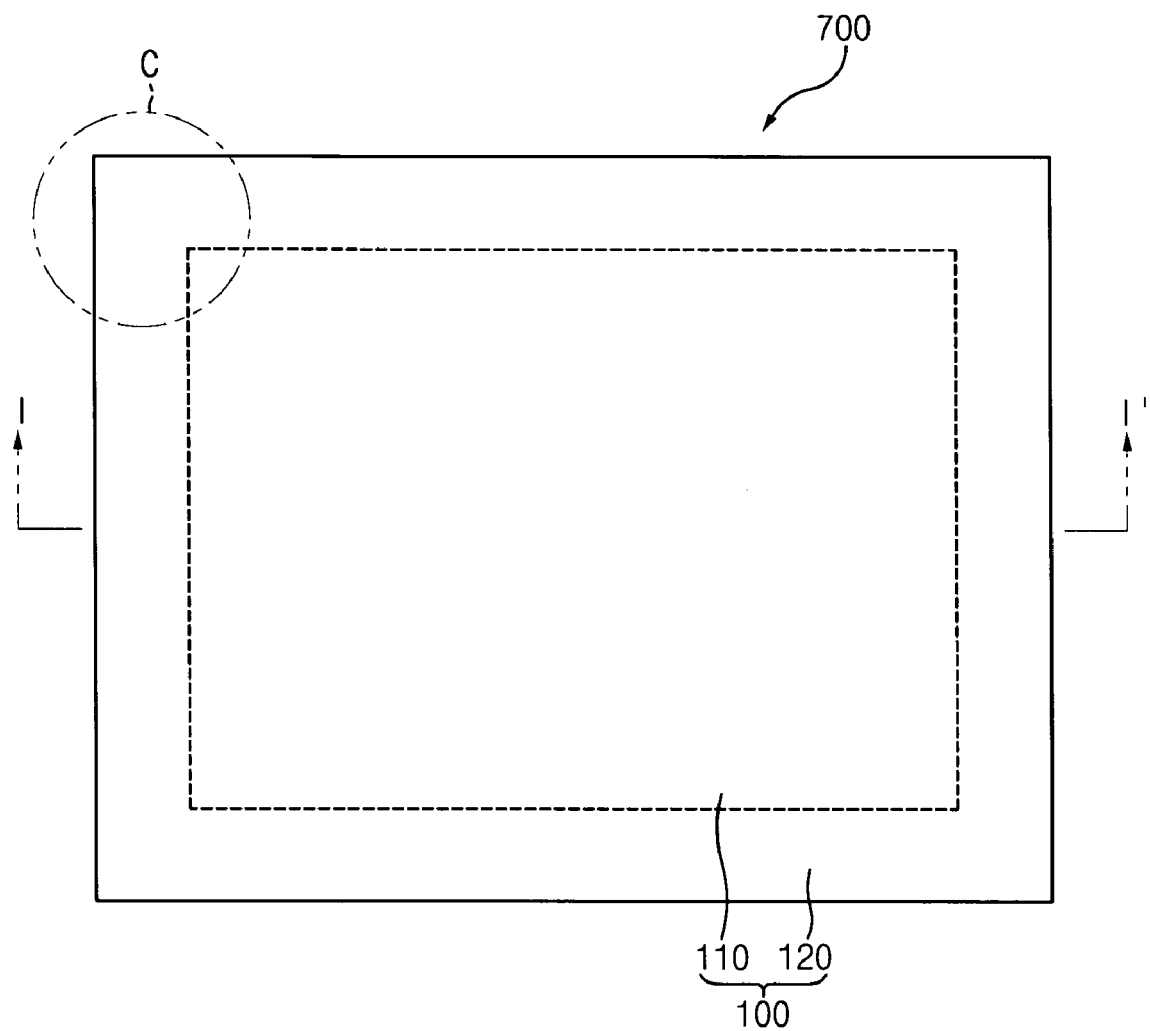
FIG. 1 is a plan view illustrating a display device in accordance with one embodiment of the present invention.
Figure 2:
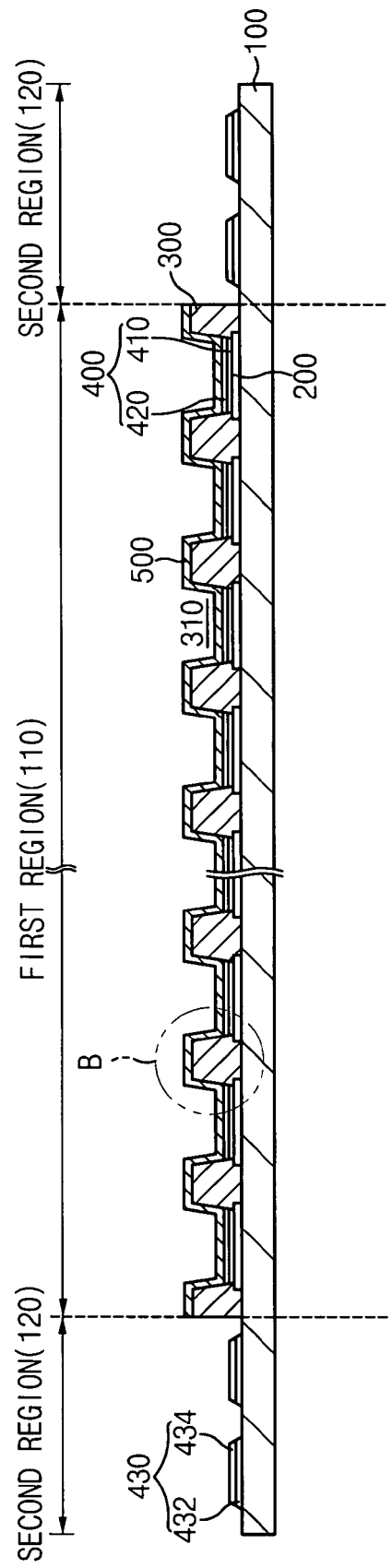
FIG. 2 is a cross-sectional view taken along a line I-I' in FIG. 1.
Figure 3:
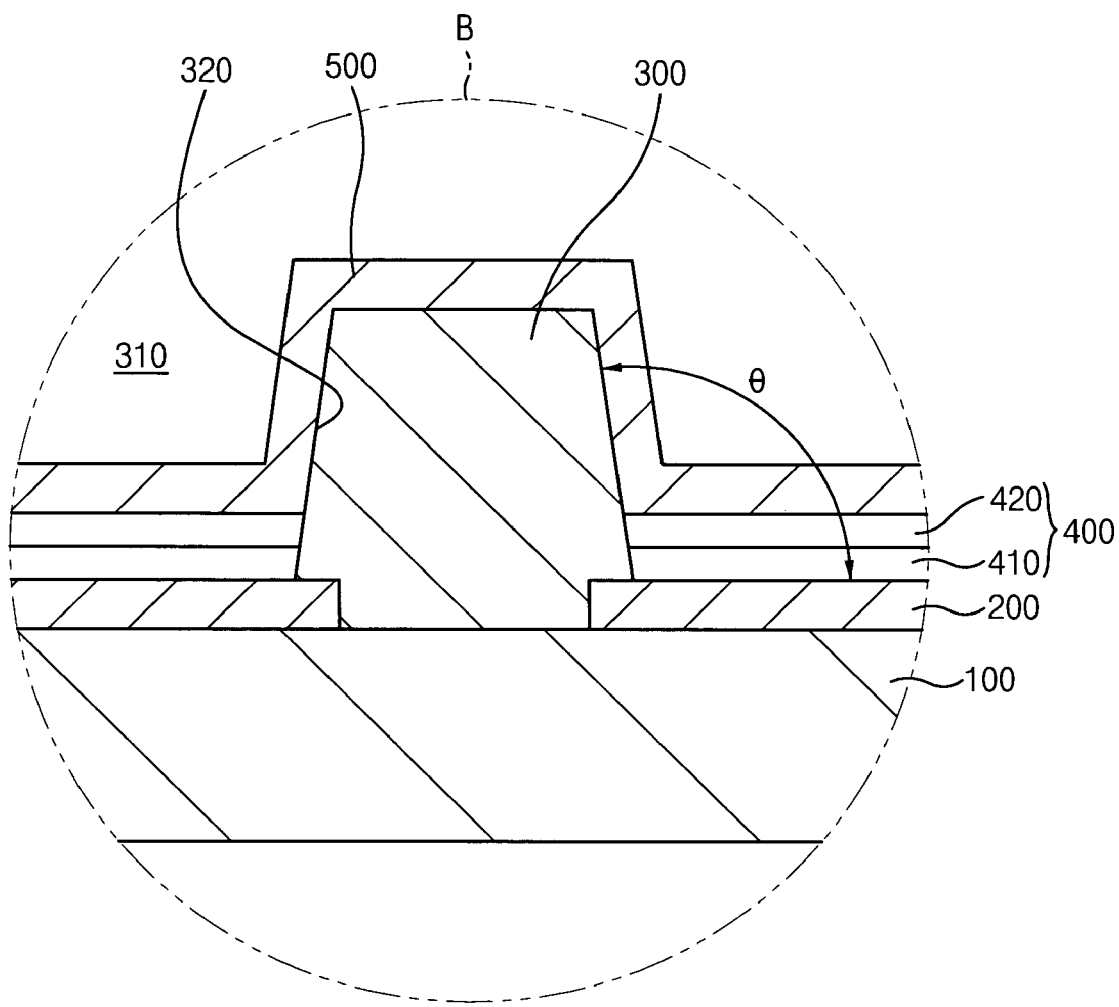
FIG. 3 is an enlarged view illustrating a portion "B" in FIG. 2.
Figure 4:
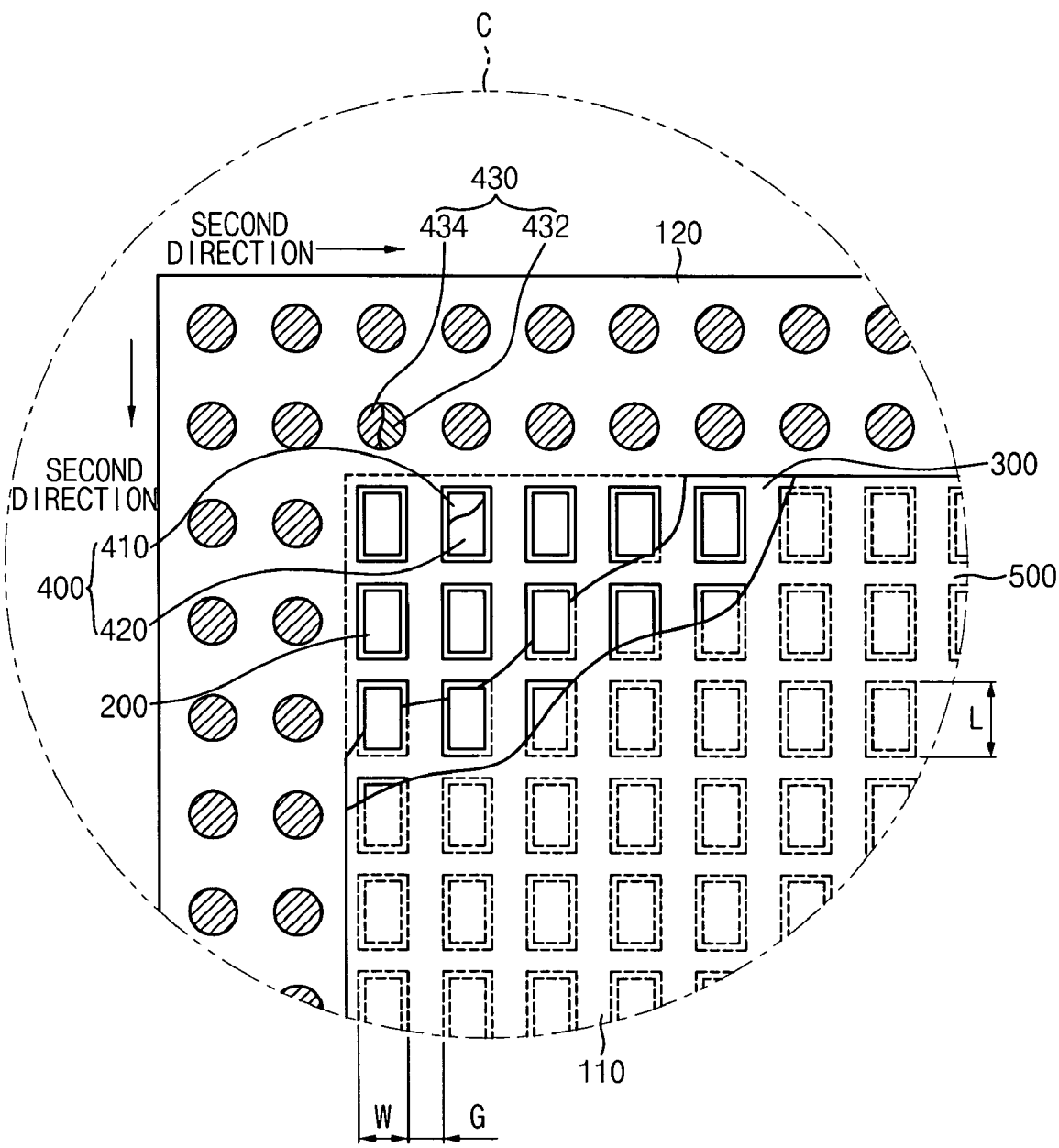
FIG. 4 is an enlarged view illustrating a portion "C" in FIG. 1.

FIG. 1 is a plan view illustrating a display device in accordance with one embodiment of the present invention. FIG. 2 is a cross-sectional view taken along a line I-I' in FIG. 1. FIG. 3 is an enlarged view illustrating a portion "B" in FIG. 2. FIG. 4 is an enlarged view illustrating a portion "C" in FIG. 1.

Referring to FIGS. 1 to 4, a display device 700 includes a substrate 100, a plurality of first electrodes 200 disposed on the substrate 100, an insulating layer 300, an organic light emitting pattern 400 and a second electrode 500.

Referring to FIG. 1, the substrate 100 includes a transparent material or an opaque material. When the substrate 100 includes the transparent material, the first electrodes 200 may include a transparent conductive material such as indium thin oxide (ITO) or indium zinc oxide (IZO).

On the contrary, when the substrate 100 includes the opaque material such as an opaque synthetic resin, the first electrode 200 may include an opaque conductive material such as aluminum or aluminum alloy.

In this embodiment, the substrate 100 includes for example the transparent material and the first electrode 200 includes ITO or IZO.

The substrate 100 includes a first region 110 and a second region 120. The first region 110 is disposed at the central portion of the substrate 100 and displays an image. The second region 120 is disposed at the peripheral portion of the first region 110. An electrical circuit and a signal wire, etc. are formed in the second region 120.

Referring again to FIG. 2 and FIG. 4, the first electrodes 200 are disposed in the first region 110 of the substrate 100, and the first electrodes 200 are arranged in a matrix configuration. In this embodiment, the first electrodes 200 include transparent conductive indium tin oxide (ITO) or indium zinc oxide (IZO).

The first electrodes 200 are disposed on the substrate 100. The first electrodes 200 have a rectangular film shape. The first electrodes 200 have a length L on the substrate 100 in a first direction and have a width W on the substrate 100 in a second direction substantially perpendicular to the first direction. The first electrodes 200 are formed such that the first electrodes 200 are spaced apart from each other by an interval G.

Each of the first electrodes 200 receives a first driving signal through a driving circuit that includes two thin film transistors (TFT), a storage capacitance and driving signal wires.

The insulating layer 300 is disposed on the substrate 100. The insulating layer includes a photosensitive organic material that reacts with a light, an organic material such as benzocyclobutene (BCB), and an inorganic material such as SiOC.

In this embodiment, the insulating layer 300 is selectively formed on the first region 110 of the substrate 100. Referring to FIGS. 2 and 3, the insulating layer 300 has openings 310. The openings 310 are disposed in the first region 110 in a matrix configuration as the first electrodes 200 are disposed on the first region 110 in a matrix configuration. Thus, the openings 310 are formed at positions corresponding to the first electrodes 200. In this embodiment, the openings 310 may have a rectangular shape, a hexagonal shape, an octagonal shape or a circular shape etc.

Each of the openings 310 may be arranged at the central portions of the first electrodes 200. Alternatively, the openings 310 are formed such that central portions of the openings 310 are deviated from the central portions of the first electrodes 200. In this embodiment, each of the openings 310 is formed on the central portion of the first electrodes 200. The openings 310 have a various function. That is, the openings 310 expose the first electrodes 200 and receive the flowable organic material in the openings 310 to prevent a spread of the organic material etc.

Referring again to FIG. 3, an angle θ formed between the first electrodes 200 and an inner wall 320 of the openings 310 is in a range of about 30° to about 165°. When the angle θ is less than about 30° or is more than about 165°, uniformity of the thickness of the organic light emitting patterns may be deteriorated so that the brightness of the light generated from the light emitting patterns may not be controlled. In this embodiment, the openings 310 formed at the insulating layer 300 are formed through a photolithography process or a dry etching process.

Referring again to FIGS. 2 and 3, the organic light emitting patterns 400 is formed on the first electrode 200 through the opening 310 formed at the insulating layer 300. The organic light emitting patterns 400 include a hole injection layer (HIL) 410 and an emitting material layer (EML) 420. The hole injection layer 410 is disposed on the first electrodes 200, and the emitting material layer 420 is disposed on the emitting material layer 420.

In order to form the organic light emitting patterns 400 on the first electrodes 200, an organic material including a volatile solvent is dropped into the openings 310 and dried so that the light emitting patterns are formed on the first electrodes 200.

The thickness of the organic light emitting patterns 400 formed thereon is affected by the speeds of drying the organic material. When the speeds of drying the organic material is different from each other, the thickness of the organic light emitting patterns 400 may not be controlled so that a brightness uniformity of lights generated from the organic light emitting patterns 400 may not be controlled. Such a problem may occur at a first electrodes 200 arranged around a boundary between the first and second regions 110 and 120.

To overcome this problem, the second region 120 has dummy light emitting patterns 430 including a dummy organic material that include the volatile solvent, so that the speed of drying the organic material positioned on the first electrodes 200 arranged around the boundary may be uniformly controlled.

Alternatively, the dummy light emitting patterns 430 are directly disposed on a passivation layer (not shown) formed on the second region 120 while the driving circuit is manufactured on the first region 110. The dummy light emitting patterns 430 include a dummy hole injection layer 432 or includes the dummy hole injection layer 432 and a dummy emitting layer 434.

When the insulating layer 300 remains on the second region 120, the dummy organic material for forming the dummy light emitting patterns 430 is positioned on the insulating layer 300 of the second region 120. Accordingly, the organic material may be capable of flowing into the opening 310 formed in the first region 110. When the dummy organic material flows into the opening 310, the display quality of the image may not be controlled.

However, in this embodiment, the dummy organic material may not flow into the opening 310 because the dummy organic material and the organic material have substantially an identical height from the substrate 100.

Figure 5:
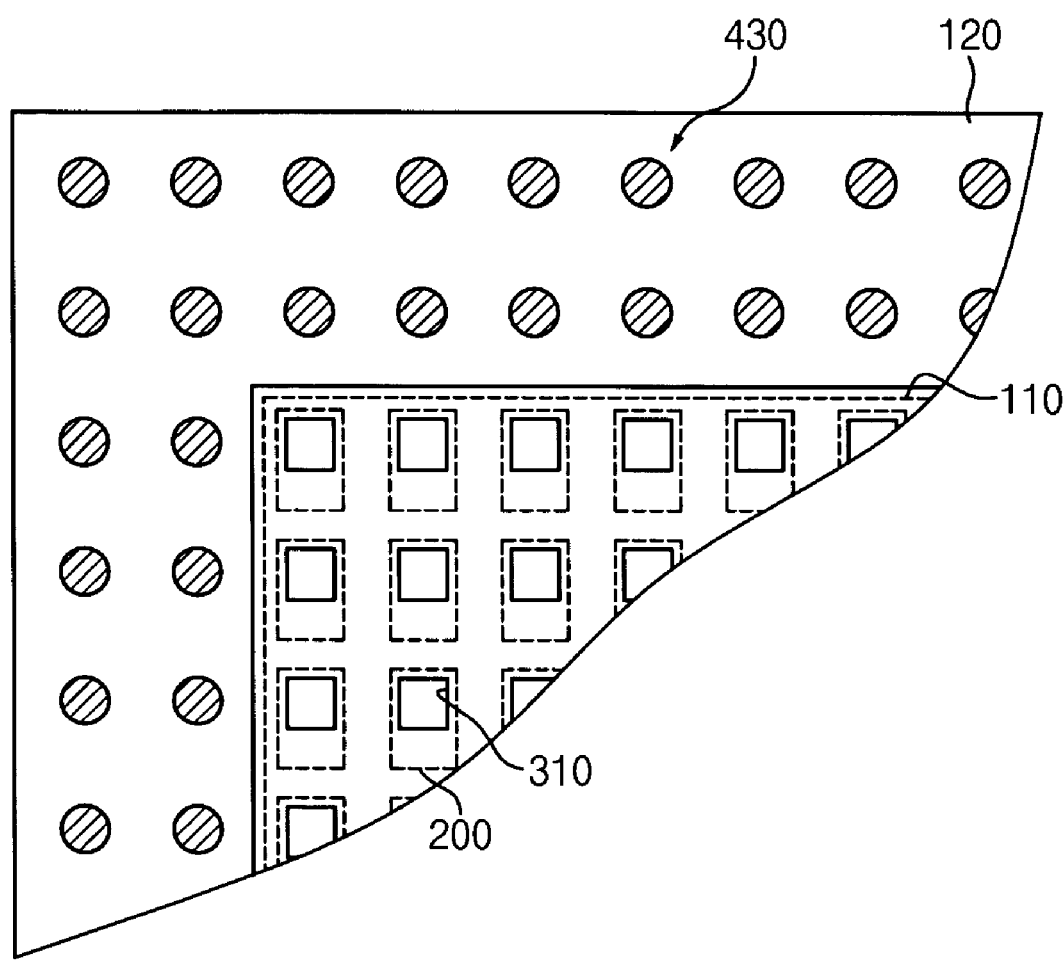
FIG. 5 is partially cut plan view illustrating another embodiment of the present invention.

FIG. 5 is partially cut plan view illustrating another embodiment of the present invention.

Referring to FIG. 5, the insulating layer 300 is extended from the first region 110 to the second region 120. The extended length of the insulating layer 300 is smaller than the length formed between the dummy organic light emitting patterns 430 and the organic light emitting patterns 400.

Alternatively, because the dummy organic light emitting patterns 430 and the organic light emitting patterns 400 are arranged at intervals apart from the width of the openings 310, the extended length of the insulating layer is smaller than the width of the openings 310.

Referring again to FIG. 2, after the organic light emitting patterns are formed on the first electrodes 200, the second electrode 500 is formed on the entire face of the substrate 100. The second electrode 500 includes aluminum or aluminum ally that has a low work function. The second electrode 500 is disposed on the insulating layer 300 and is electrically connected to the organic light emitting patterns 400.

A second driving signal for displaying the image generated from a driving circuit (not shown) formed on a second region 120 is provided with the second electrode 500.

Figure 6:
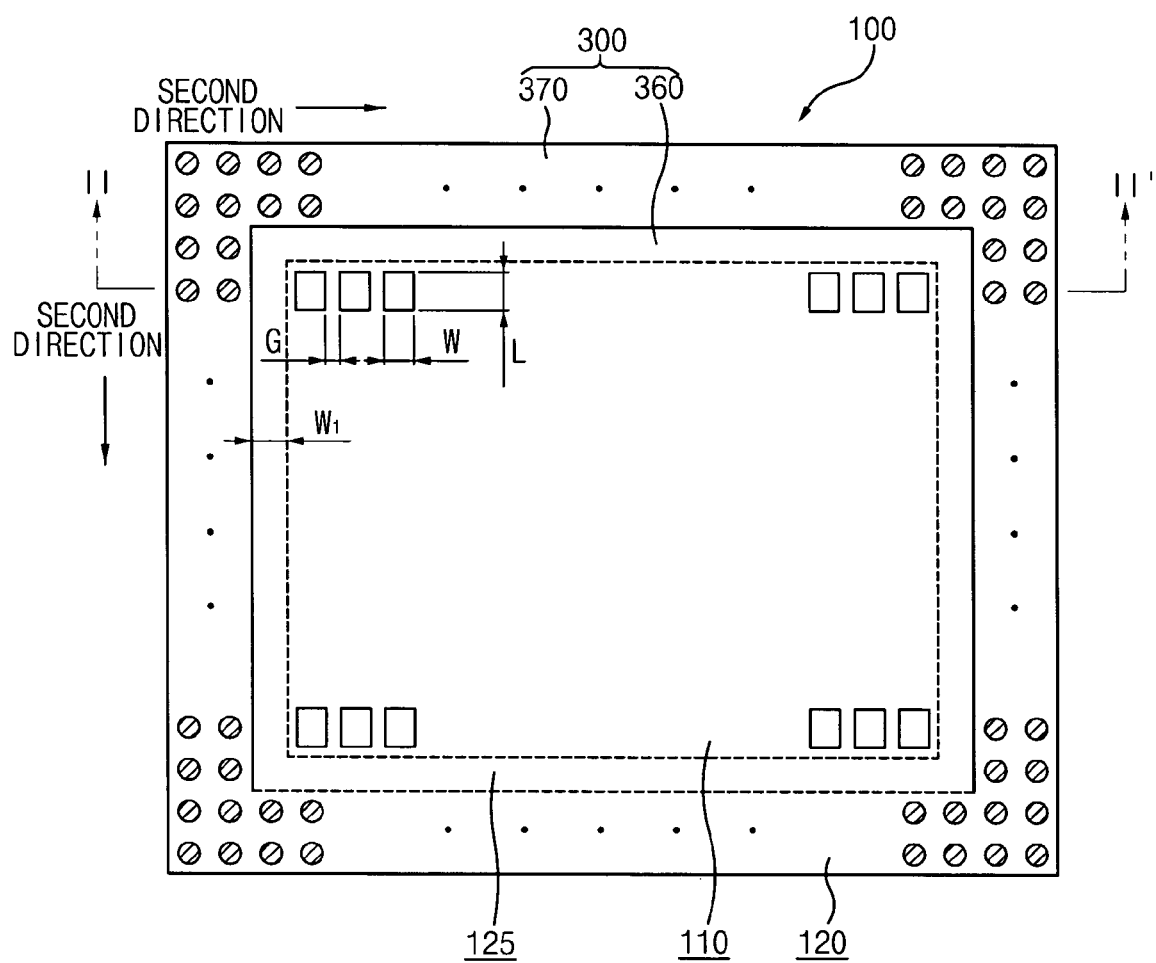
FIG. 6 is a plan view illustrating a display device in accordance with another embodiment of the present invention.
Figure 7:
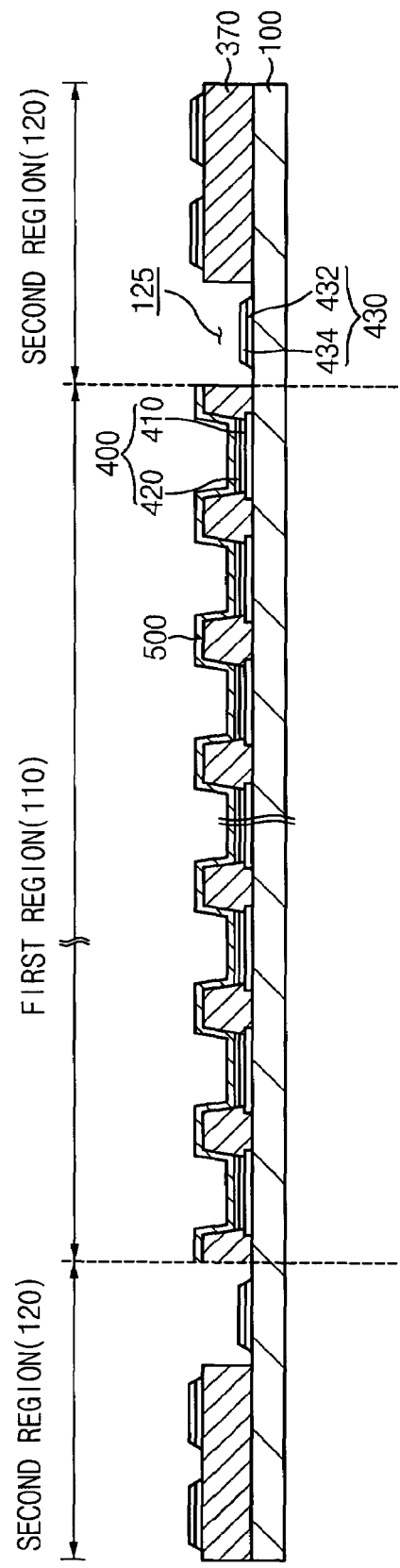
FIG. 7 is a cross-sectional view taken along a line II-II' in FIG. 6.

FIG. 6 is a plan view illustrating a display device in accordance with another embodiment of the present invention. FIG. 7 is a cross-sectional view taken along a line $B_1$-$B_2$ in FIG. 6.

Referring to FIGS. 6 and 7, a display device 700 includes a plurality of first electrodes 200, an insulating layer 300, organic light emitting patterns 400 and a second electrode 500.

The substrate 100 includes a transparent substrate or an opaque substrate. When the substrate 100 includes the transparent substrate, the first electrodes 200 include a transparent conductive material, for example, indium thin oxide (ITO) or indium zinc oxide (IZO).

On the contrary, when the substrate 100 includes the opaque substrate that includes an opaque synthetic resin material, the first electrodes 200 include an opaque conductive material. For example, the first electrodes 200 include aluminum or aluminum alloy. In this embodiment, the substrate 100 includes the transparent substrate.

The substrate 100 includes a first region 110 and a second region 120. The first region 110 is disposed at the central portion of the substrate 100 to display an image. The second region 120 is disposed at the peripheral portion of the first region 110 to form an electrical circuit.

The first electrodes 200 are disposed in the first region 110 of the substrate 100 in a matrix configuration. In this embodiment, the first electrodes 200 may have a rectangular shape. The first electrodes 200 have a length L in a first direction and have a width W in a second direction substantially perpendicular to the first direction. The first electrodes 200 are formed at regular intervals spaced apart from each other. In addition, each of the first electrodes 200 has the regular intervals of about G.

A first driving signal for displaying the image generated from a driving circuit (not shown) is provided with the first electrodes 200. The driving circuit includes two thin film transistors (TFT), storage capacitor and driving signal wires.

The insulating layer 300 includes a first insulating layer 360 and a second insulating layer 370. The first insulating layer 360 is positioned on the first region 110 of the substrate 100. A first insulating layer 360 includes a photosensitive organic material that reacts with a light, an organic material such as benzocyclobutene (BCB), an inorganic material such as SiOC.

The first insulating layer 360 has a plurality of openings 310. The openings 310 are formed at positions corresponding to the first electrodes 200. The openings 310 are disposed in the first region 110 in a matrix configuration because the first electrodes 200 are disposed on the first region 110 in a matrix configuration.

In this embodiment, the openings 310 may have a rectangular shape, a hexagonal shape, an octagonal shape or a circular shape in plane.

Each of the openings 310 may be arranged at the central portion of the first electrodes 200. The openings 310 may be eccentrically arranged relative to the central portion of the first electrodes 200. In this embodiment, the openings 310 are eccentrically arranged relative to the central portion of the first electrodes 200. The openings 310 have a various function as the exposing of the first electrodes 200 or a receiving of the flowable organic material in the openings 310.

The second insulating layer 370 is positioned on the second region 120. The second insulating layer 370 is formed at regular intervals spaced apart from the first insulating layer 360 in plane. As a result, a groove 125 is formed between the first and second insulating layers 360 and 370. The width of the groove 125 is broader than the width of the opening 310.

The groove 125 prevents the dummy organic material disposed in the second region 110 from flowing into the opening 310.

The organic light emitting patterns 400 are disposed on the first electrodes 200 through the opening 310 formed at the insulating layer 300. The organic light emitting patterns 400 include a hole injection layer 410 and a light emitting layer 420. The light emitting layer 430 is positioned on the hole injection layer 420.

In order to form the organic light emitting patterns, an organic material having a volatile solvent is dropped and dried into the opening 310 so that the light emitting patterns are formed on the first electrodes 200.

The thickness of the organic light emitting-patterns 400 formed thereon is affected by the speeds of drying the organic light emitting patterns 400. When the speeds of drying the organic light emitting-patterns 400 are different each other, the thickness of the organic light emitting patterns 400 may not be controlled so that a brightness uniformity of lights generated from the organic light emitting patterns 400 may not be controlled. Such a problem may occur at a first electrodes 200 arranged around a boundary between first and second regions 110 and 120.

To overcome this problem, the second region has dummy light emitting patterns 430 including a dummy organic material that has the volatile solvent, so that the speed of drying the organic material positioned on the first electrodes 200 arranged around the boundary may be uniformly controlled.

Alternatively, the dummy light emitting patterns 430 may be directly disposed on a passivation layer (not shown) formed on the second region 120 while the driving circuit is manufactured on the first region 110. The dummy light emitting patterns 430 include a dummy hole injection layer 432 and a dummy emitting layer 434 formed thereon.

When the insulating layer 300 remains on the second region 120, the dummy organic material for forming the dummy light emitting patterns 430 is positioned on the insulating layer 300 of the second region 120. Accordingly, the organic material may be capable of flowing into the opening 310 formed in the first region 110. When the dummy organic material flows into the opening 310, the display quality of the image may not be controlled.

However, in this embodiment, the dummy organic material may not flow into the opening 310 because the groove 125 is formed between the first and second insulting layer 360 and 370. The dummy organic material positioned in the groove 125 and the organic material positioned on the first electrodes 200 have substantially an identical height from the substrate 100.

After the organic light emitting patterns are formed on the first electrode 200, the second electrode 500 is formed on the entire face of the substrate 100. The second electrode 500 includes aluminum or aluminum ally that has a low work function. The second electrode 500 is disposed on the insulating layer 300 and is electrically connected to the organic light emitting patterns 400.

A second driving signal for displaying the image generated from a driving circuit (not shown) formed on a second region 120 is provided with the second electrode 500.

Figure 8:
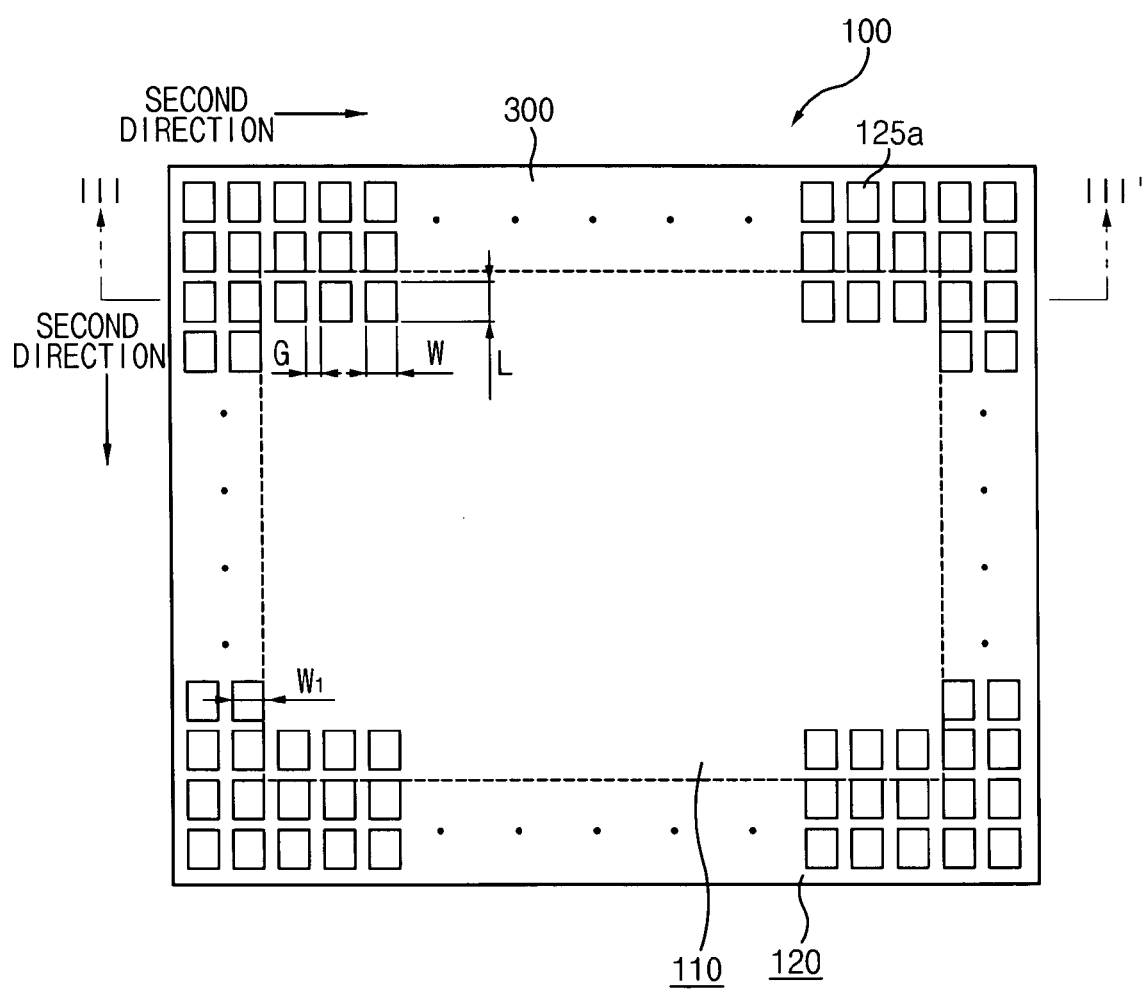
FIG. 8 is a plan view illustrating a display device in accordance with another embodiment of the present invention.
Figure 9:
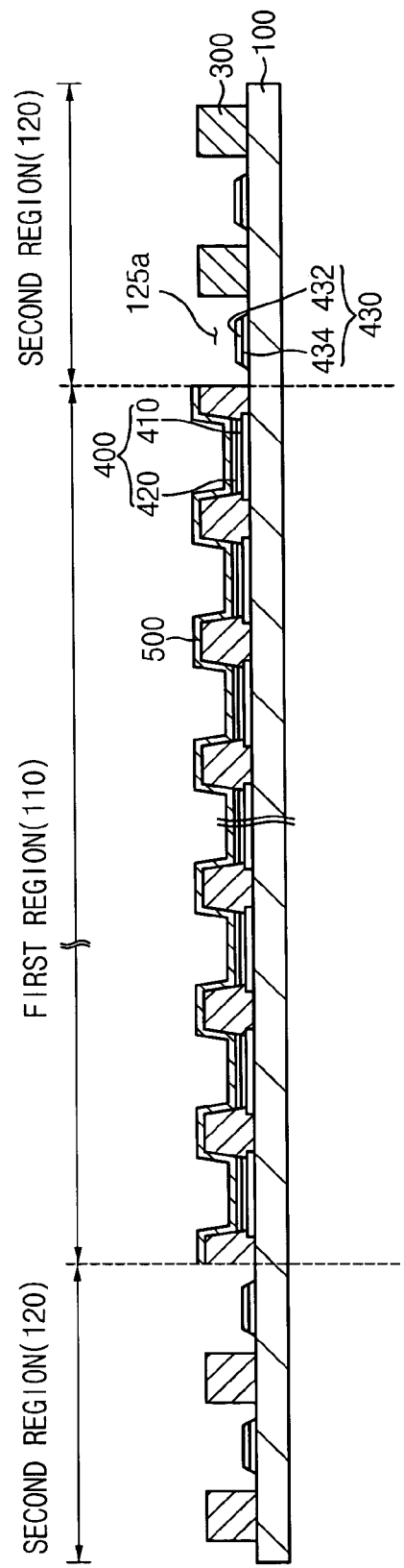
FIG. 9 is a cross-sectional view taken along a line III-III' in FIG. 8.

FIG. 8 is a plan view illustrating a display device in accordance with another embodiment of the present invention. FIG. 9 is a cross-sectional view taken along a line $B_3$-$B_4$ in FIG. 8.

Referring to FIGS. 8 and 9, a display device 700 includes a substrate 100, a plurality of first electrodes 200, an insulating layer 300, an organic light emitting pattern 400 and a second electrode 500.

The substrate 100 includes a transparent substrate or an opaque substrate. When the substrate 100 includes the transparent substrate, the first electrodes 200 include a transparent conductive material, for example, indium thin oxide (ITO) or indium zinc oxide (IZO).

On the contrary, when the substrate 100 includes the opaque substrate that has an opaque synthetic resin material, the first electrode 200 includes an opaque conductive material, for example, aluminum or aluminum alloy. In this embodiment, the substrate 100 includes the transparent substrate.

The substrate 100 includes a first region 110 and a second region 120. The first region 110 is disposed at the central portion of the substrate 100 to display an image. The second region 120 is disposed at the peripheral portion of the first region 110 to form an electrical circuit.

The first electrodes 200 are disposed in the first region 110 of the substrate 100 in a matrix configuration. In this embodiment, the first electrodes 200 may have a rectangular shape. The first electrodes 200 have a length L in a first direction and have a width W in a second direction substantially perpendicular to the first direction. The first electrodes 200 are formed at regular intervals spaced apart from each other. In addition, each of the first electrodes 200 has the regular intervals of about G.

A first driving signal for displaying the image generated from a driving circuit (not shown) is provided with the first electrodes 200. The driving circuit includes two thin film transistors (TFT), storage capacitor and driving signal wires.

The insulating layer 300 is positioned on the substrate 100. The insulating layer 300 includes a photosensitive organic material that reacts with a light, an organic material such as benzocyclobutene (BCB), an inorganic material such as SiOC.

In this embodiment, the insulating layer 300 is selectively formed on the first region 110 of the substrate 100. In addition, the insulating layer 300 has first openings 310 and second openings 125a.

The first openings 310 are formed at positions corresponding to the first electrodes 200. The first openings 310 are disposed in the first region 110 in a matrix configuration because the first electrodes 200 are disposed on the first region 110 in a matrix configuration. In this embodiment, the first opening 310 may have a rectangular shape, a hexagonal shape, an octagonal shape or a circular shape in plane.

Each of the first openings 310 may be arranged positions at the central portion of the first electrodes 200. The first openings 310 may be eccentrically arranged relative to the central portion of the first electrodes 200. In this embodiment, the first openings 310 are eccentrically arranged relative to the central portion of the first electrodes 200. The first openings 310 have a various function as the exposing of the first electrodes 200, a receiving of the flowable organic material, etc.

The second openings 125a are formed on the second region 120 of the insulating layer 300. The second openings 125a are arranged in a matrix configuration. Intervals between the second openings 125a are substantially identical to the intervals between the first openings 310. The gap formed between the first and second openings 310 and 125a is narrower than the width of the first and second openings 310 and 125a.

The organic light emitting patterns 400 are disposed on the first electrode 200 through the first opening 310 formed on the insulating layer 300. The organic light emitting patterns 400 include a hole injection layer 410 and a light emitting layer 420. The hole injection layer 410 is positioned on the first electrode 200 and the light emitting layer 420 is disposed on the hole injection layer 410.

In order to form the organic light emitting patterns, an organic material having a volatile solvent is dropped and dried into the opening 310 so that the light emitting patterns are formed on the first electrodes 200.

The thickness of the organic light emitting-patterns 400 formed thereon are affected by the speeds drying of the organic light emitting-patterns 400. When the speeds of drying the organic light emitting-patterns 400 is different each other, the thickness of the organic light emitting-patterns 400 may not be controlled so that a brightness uniformity of lights generated from the organic light emitting-patterns 400 may not be controlled. Such a problem may occur at a first electrodes 200 arranged around a boundary between first and second regions 110 and 120.

To overcome this problem, the second region has dummy light emitting patterns 430 including a dummy organic material that has the volatile solvent, so that the speed of drying the organic material positioned on the first electrodes 200 arranged around the boundary may be uniformly controlled.

Alternatively, the dummy light emitting patterns 430 may be directly disposed on a passivation layer (not shown) formed on the second region 120 while the driving circuit is manufactured on the first region 110. The dummy light emitting patterns 430 includes a dummy hole injection layer 432 or includes the dummy hole injection layer 432 and a dummy emitting layer 434.

When the insulating layer 300 remains on the second region 120, the dummy organic material for forming the dummy light emitting patterns 430 is positioned on the insulating layer 300 of the second region 120. Accordingly, the organic material may be capable of flowing into the openings 310 formed in the first region 110. When the dummy organic material flows into the openings 310, the display quality of the image may not be controlled.

However, in this embodiment, the dummies organic material may not flow into the openings 310 because the dummy organic material and the organic material have substantially an identical height from the substrate 100.

After the organic light emitting patterns 400 forms on the first electrode 200, the second electrode 500 is formed on the entire face of the substrate 100. The second electrode 500 includes aluminum or aluminum ally that has a low work function. The second electrode 500 is disposed on the insulating layer 300 and is electrically connected to the organic light emitting patterns 400.

A second driving signal for displaying the image generated from a driving circuit (not shown) formed on a second region 120 is provided with the second electrode 500.

Method of Manufacturing of a Display Device

Figure 10:
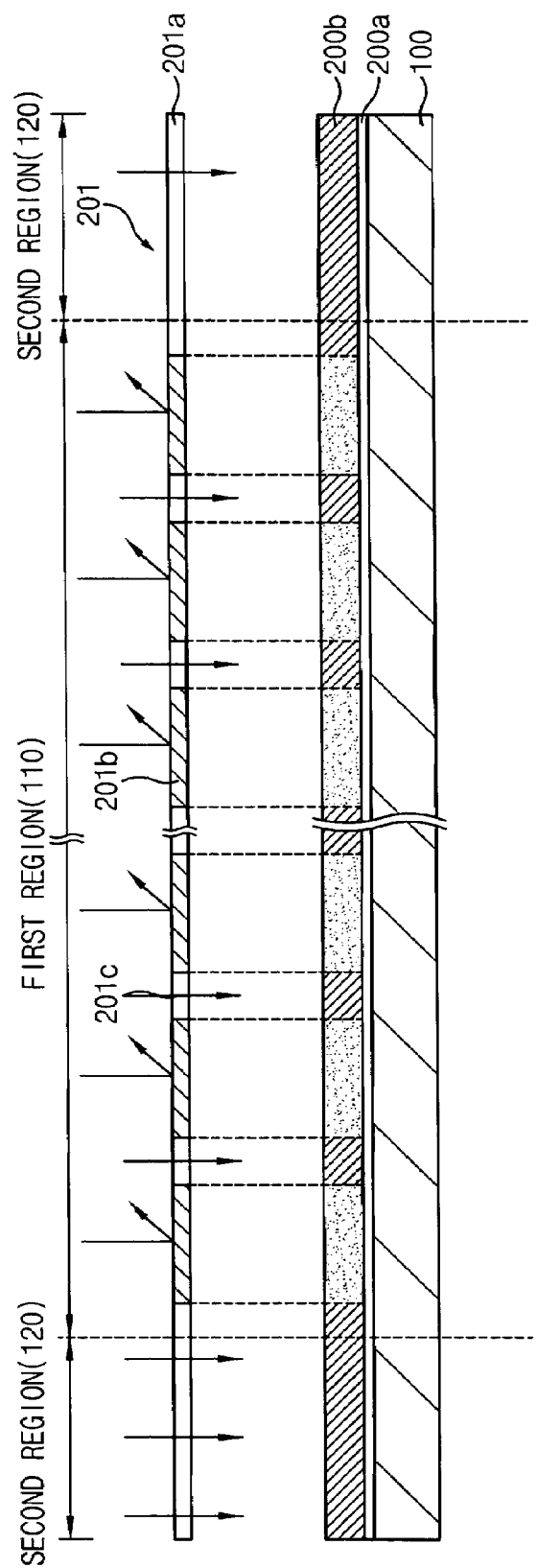

FIG. 10 is a cross-sectional view illustrating a substrate in accordance with still another embodiment of the present invention.

Referring to FIG. 10, the substrate 100 includes a first region 110 for displaying an image and a second region 120 disposed at a peripheral portion of the first region 110.

A first conductive layer 200a including ITO or IZO is formed on the entire face of the substrate 100. The first conductive layer 200a is formed by a sputtering process or a chemical vapor deposition (CVD) process.

Then, a photo resist material is coated on the first conductive layer 200a by a spin coating process or a slit coating process, so that a photoresist film 200b is formed on the first conductive layer 200a.

Next, a mask 201 aligns over the substrate 100. The mask 201 has a transparent body 201a, light absorbing portions 201b and light transmitting portions 201c. The light absorbing portions 201b having a quadrangular shape are formed on the transparent body in a matrix configuration. The light transmitting portions are formed between the light absorbing portions 201b in a lattice configuration.

Then, a light generated from a light source (not shown) travels onto the photoresist film 200b through the light transmitting portion 201c of the mask 201. A photoresist film 200b is exposed to the light so that a photoresist pattern 200c is formed on the first conductive layer 200a by a development process.

Figure 11:
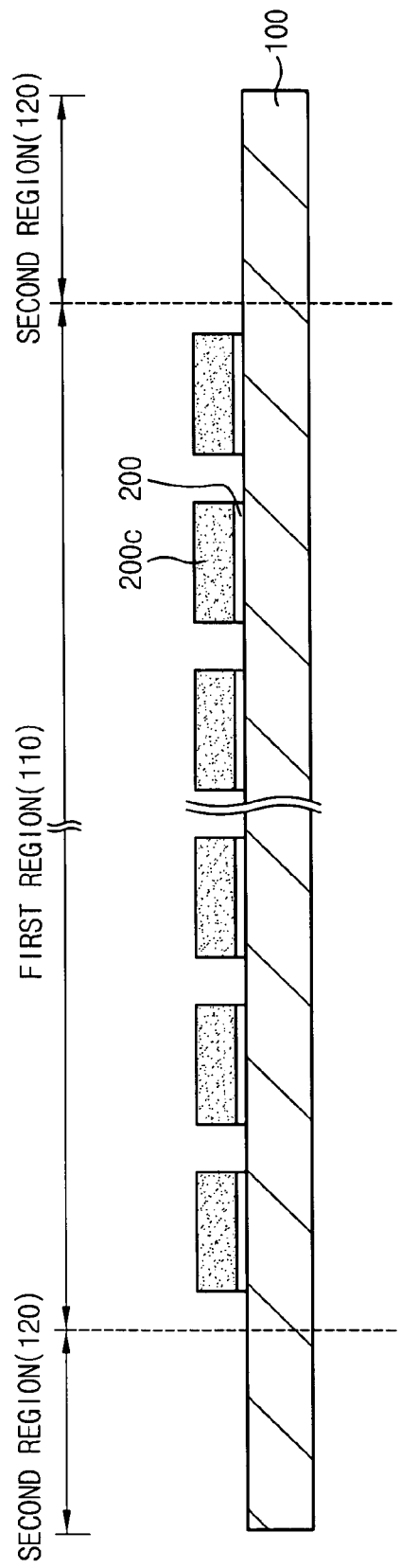

FIG. 11 is a cross-sectional view illustrating a first electrode and a photoresist pattern in accordance with still another embodiment of the present invention.

Referring to FIG. 11, a portion of the first conductive layer 200a exposed to the photoresist pattern 200c is etched by a dry etching process or a wet etching process so that a first electrodes 200 are formed on the substrate 100 in a matrix configuration.

In this embodiment, a driving circuit part for providing a driving voltage is formed on the substrate 100 before the first electrode 200 is formed on the substrate 100.

Figure 12:
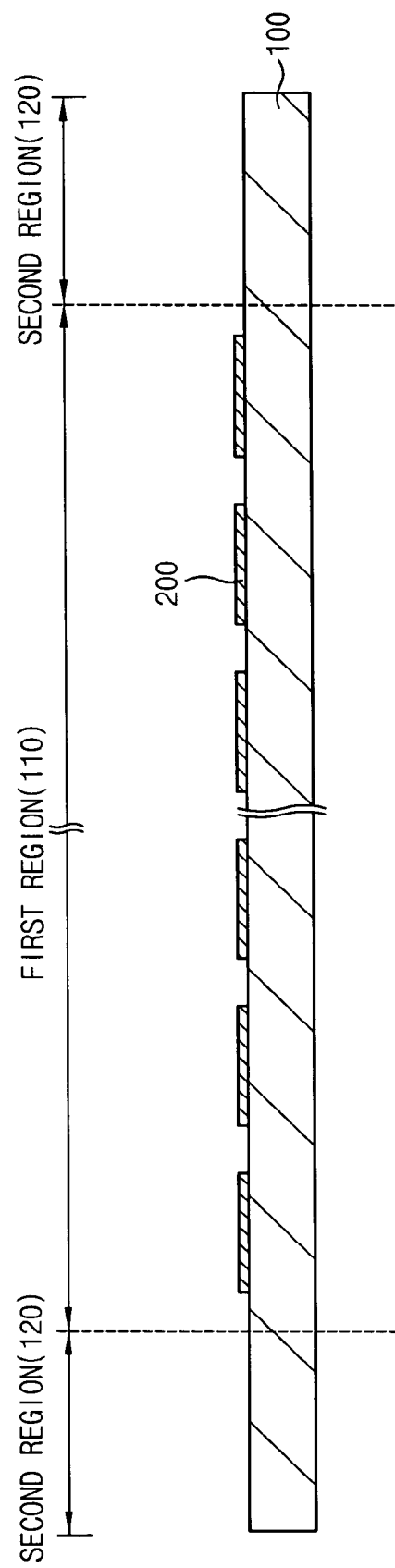

FIG. 12 is a cross-sectional view illustrating the first electrode in FIG. 11.

Referring to FIG. 12, the photoresist pattern 200c for forming the first conductive layer 200a is removed by a photoresist stripper solution so that the first electrodes 200 are disposed on the substrate 100 in a matrix configuration.

Figure 13:
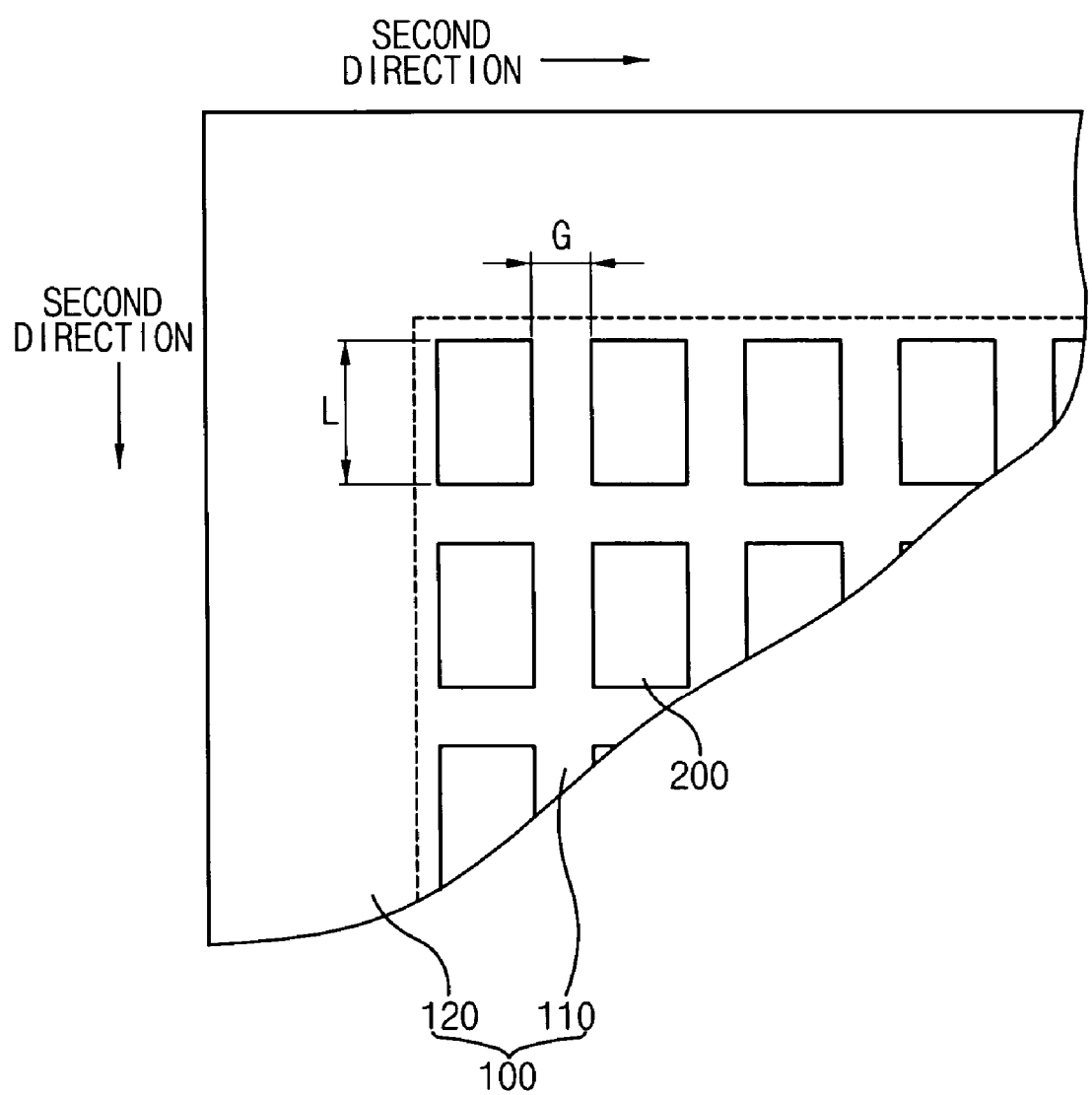

FIG. 13 is a plan view illustrating the first electrodes formed on the substrate in FIG. 12.

Referring to FIG. 13, the first electrodes 200 formed on the substrate 100 are formed at portions at regular intervals G spaced apart from each other. The first electrodes 200 having a quadrangular shape have a length L in a first direction and have a width W in a second direction substantially perpendicular to the first direction.

Figure 14:
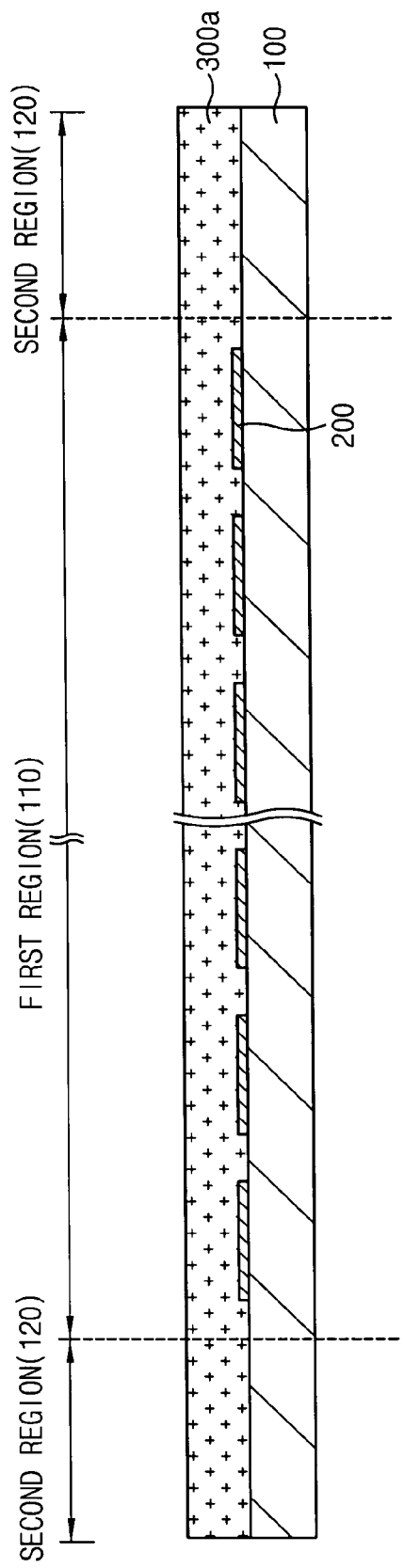

FIG. 14 is a cross-sectional view illustrating an insulating layer formed on the substrate in FIG. 13.

Referring to FIG. 14, an insulating layer is formed on the entire face of the substrate 100 to cover the first electrodes 200. At this time, the insulating layer may include an organic material or an inorganic material. The organic material may include such as a photoresist material or benzocyclobutene (BCB) and the inorganic material may include such as a SiOC. In this embodiment, the insulating layer includes the photoresist material.

Figure 15:
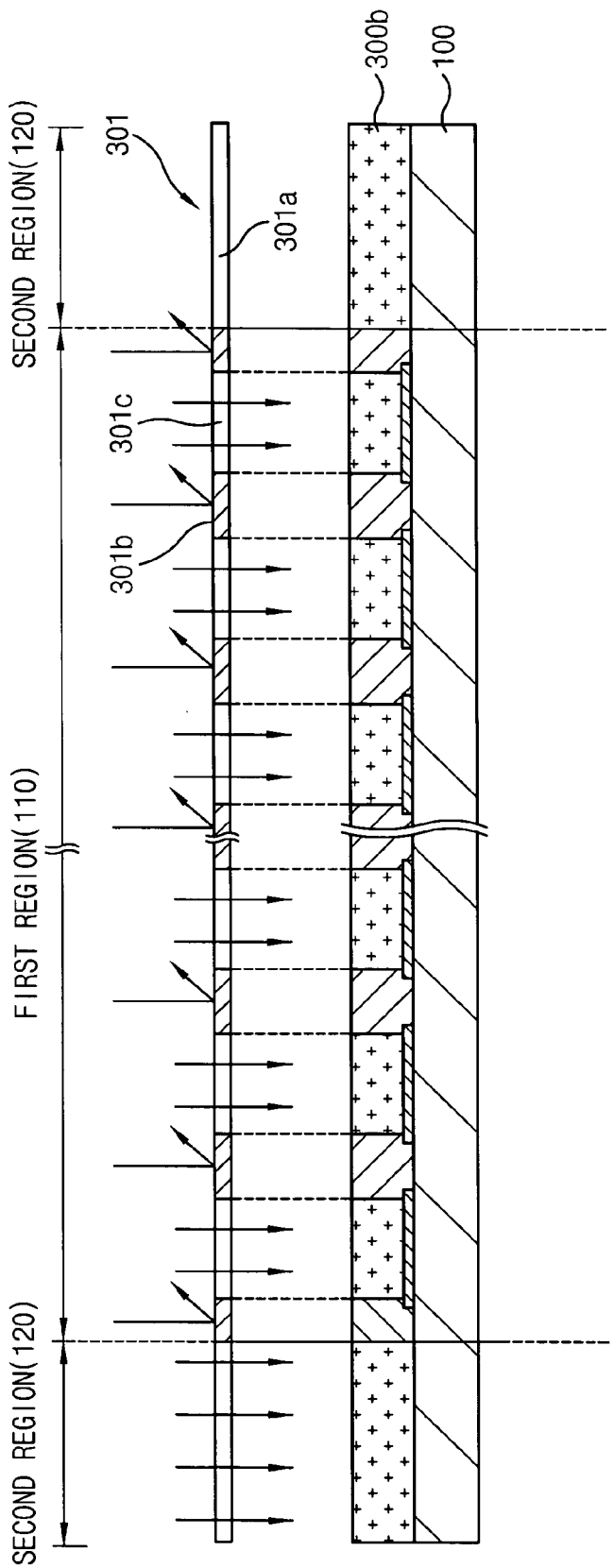

FIG. 15 is a cross-sectional view illustrating the insulating pattern in FIG. 14.

Referring to FIG. 15, a mask 301 aligns over the insulating layer 300b. The mask 301 selectively provides a light generated from a light source (not shown) from the insulating layer 300b. In this embodiment, the insulating layer is selectively exposed to the light passing therethrough.

For this, the mask 301 has a transparent body 301a, light absorbing portions 301b and light transmitting portions 301c. The light transmitting portions 301c are formed on the transparent body 301a corresponding to the first electrode 200 in a lattice configuration. The light absorbing portions 301b are formed between the light transmitting portions 301c.

In state that the mask 301 aligns over the substrate 100, the light generated from the light source travels onto the insulating layer 300a passing through the light transmitting portions 301c of the mask 301, so that the insulating layer 300a is partially exposed to the light.

Figure 16:
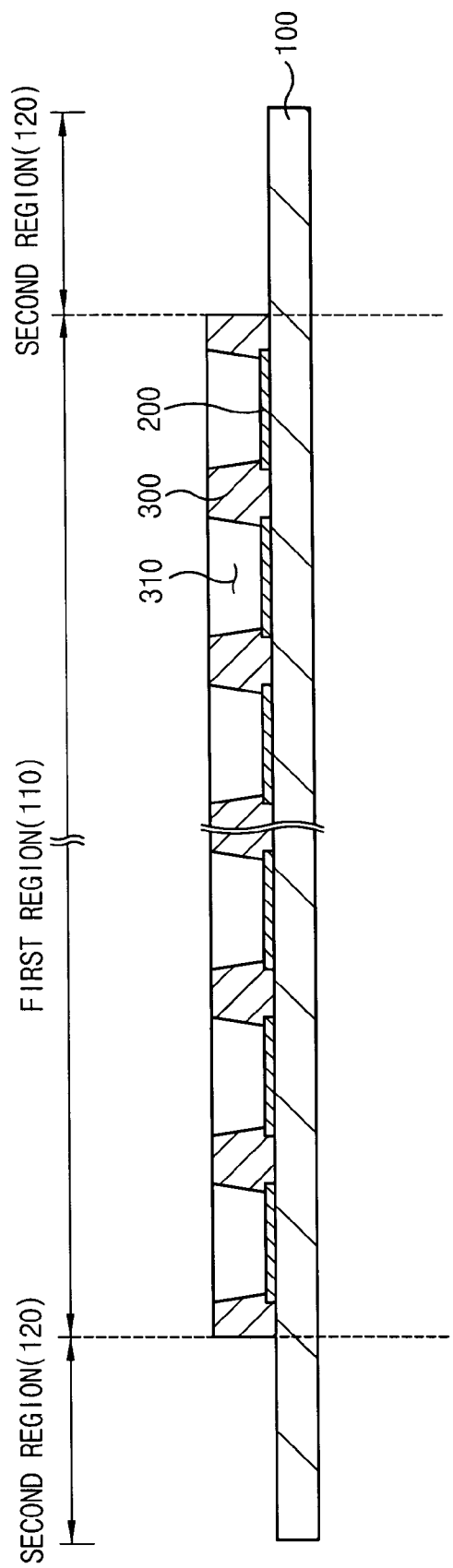

FIG. 16 is a cross-sectional view illustrating isolation patterns formed on the substrate in FIG. 15.

Referring to FIG. 16, the insulating layer 300a exposed to the light is developed with a developing solution. Accordingly, the insulating layer 300 formed at the second region 120 and the insulating layer 300a corresponding to the first electrode 200 are removed to the insulating layer 300a so that isolation patterns 300 having an opening 310 are formed on the substrate 100. Alternatively, the isolation patterns may be capable of including the photoresist material as well as the BCB or the SiOC. Also, the isolation patterns are formed by a photo process or a dry etching process.

The openings 310 formed at the insulating layer 300a have a circular shape or quadrangular shape in plane.

An angle formed between the first electrodes 200 and the sidewall of the openings 310 has substantially about 30° to about 165°. When the angle has about 30° to about 165°, the thickness of an organic light emitting layer 400 formed on the first electrodes 200 may be precisely controlled.

Each of the openings 310 may be arranged positions at the central portion of the first electrodes 200 or may be eccentrically arranged positions relative to the central portion of the first electrodes 200. In this embodiment, the openings 310 are eccentrically arranged relative to the central portion of the first electrodes 200.

Figure 17:
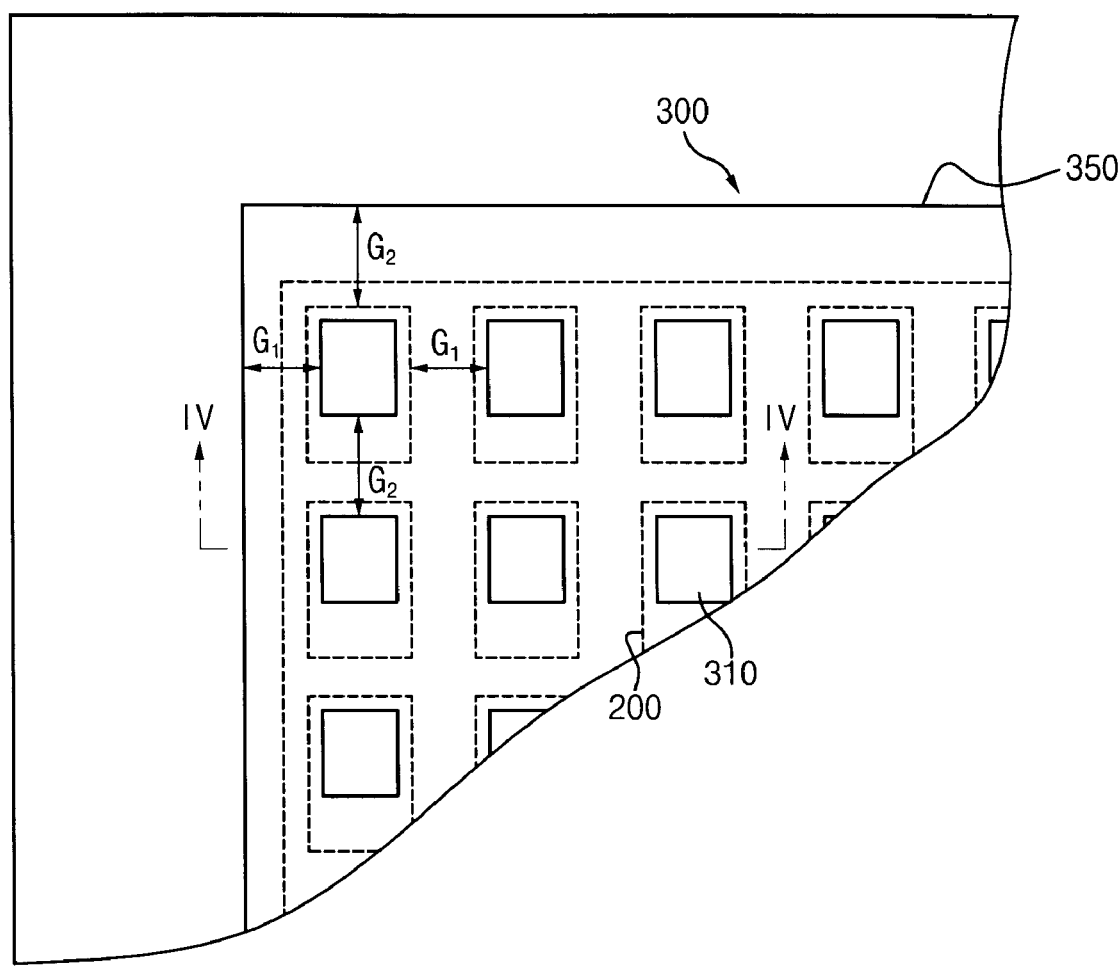
Figure 18:
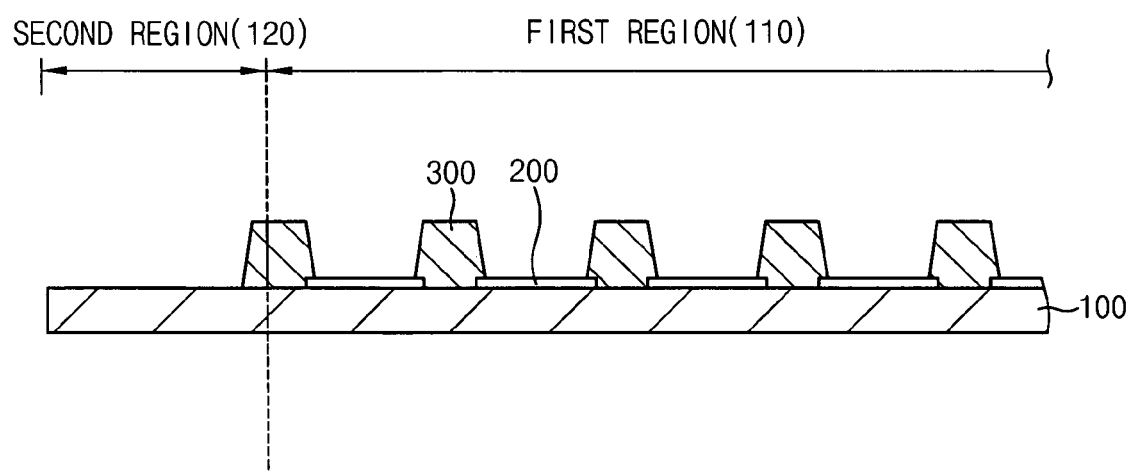

FIG. 17 is a plan view illustrating isolating patterns in accordance with another embodiment of the present invention. FIG. 18 is a cross-sectional view taken along a line $D_1$-$D_2$ in FIG. 17.

Referring to FIGS. 17 and 18, in this embodiment, isolating patterns 300 are extended from the boundary of the first and second regions 110 and 120 to the second region 120. An extended length of the isolating patterns 300 is narrower than the widths of the openings 310.

FIG. 19 is a cross-sectional view illustrating an organic light emitting patterns formed in the first and second regions in FIG. 17.

Referring to FIG. 19, organic light emitting patterns are formed in the openings 310 of the isolation patterns 300 positioned on the first region 110. To form the organic light emitting patterns, a hole injection layer 410 including a hole injection material is formed on the first electrodes 200. The hole injection material having a droplet shape is dropped into the openings 310 of the isolation patterns 300 by a spraying nozzle and the hole injection material is dried.

The hole injection material includes a volatile solvent and the thicknesses of the hole injection layers 410 are difference in accordance with a speed of drying the hole injection material. When the thicknesses of the hole injection layers 410 are difference each other, a display failure may occurs to the display device.

In order to prevent this problem, a dummy hole injection layer 430 is formed on the second region 120 at a regular intervals spaced apart form the hole injection layers 410 to control the speeds of drying the hole injection layers 410.

Next, the light emitting material is dropped in the openings 310 and the light emitting material is dried to form the light emitting layer 420. In addition, a dummy light emitting material is dropped in the second region 120 and the light emitting material is dried to control the speed of drying the dummy light emitting material.

FIG. 20 is a cross-sectional view illustrating a second electrode formed on the substrate in FIG. 19.

Referring to FIG. 20, after the first electrode 200, the isolating patterns 300, the organic light emitting patterns 400 are sequentially formed on the substrate 100, the second electrode 500 is formed on the substrate 100 to electrically connect to the organic light emitting patterns 400. The second electrode 500 includes a metal, for example, aluminum, aluminum ally etc. The second electrode 500 is formed on the entire face of the substrate 100.

Having described the exemplary embodiments of the present invention and its advantages, it is noted that various changes, substitutions and alterations can be made herein without departing from the spirit and scope of the invention as defined by appended claims.

The invention claimed is:

1. A display device comprising:
a substrate comprising a first region and a second region surrounding the first region;
a plurality of first electrodes disposed in the first region;
an insulation member arranged in the first region and comprising a plurality of openings that exposes a portion corresponding to each of the first electrodes;
light emitting patterns disposed directly on the first electrodes, the light emitting patterns filling up the openings, respectively;
a plurality of dummy light emitting patterns directly formed on the substrate in the second region; and
a single second electrode formed on substantially an entire face of the substrate, the single second electrode disposed on the light emitting patterns and directly on the insulation member.

2. The display device of the claim 1, wherein the openings comprise a rectangular shape that comprises a pair of long sides and a pair of short sides, and the openings are arranged in a matrix shape along a first direction that is substantially parallel with the long sides and a second direction that is substantially parallel with the short sides in the first region.

3. The display device of the claim 2, wherein a side face of the insulation member is extended from the first region to the second region in the first direction and an extending length of the insulation member is equal to or less than a width formed between the openings.

4. The display device of the claim 2, wherein a side face of the insulation member is extended from the first region to the second region in the second direction, and an extending length is equal to or less than a width formed between the openings.

5. The display device of the claim 1, wherein the openings are essentially disposed on the center of the first electrodes, respectively.

6. The display device of the claim 1, wherein each of the light emitting patterns comprises a hole injection layer and a light emitting layer, and the light emitting layer is formed on the hole injection layer.

7. The display device of the claim 1, wherein an inside wall of the openings comprises an angle about 30° to 165° with respect to the first electrodes formed on the substrate.

8. The display device of the claim 1, wherein the first electrodes comprises a transparent conductive material, and the second electrode comprises an opaque conductive material.

9. The display device of the claim 1, wherein the insulation member comprises an organic material, an inorganic material or a photoresist material.

10. The display device of the claim 1, wherein the insulation member extends to a height greater than that of the light emitting patterns.

11. A display device comprising:
a substrate comprising a first region and a second region surrounding the first region;
a plurality of first electrodes disposed in the first region;
an insulation member formed on a whole surface of the substrate to cover the first electrodes, the insulation member comprising a groove and a plurality of openings, the grooves formed between the first and second regions, and the openings formed on the first electrode;
light emitting patterns disposed directly on the first electrodes, the light emitting patterns filling up the openings, respectively, each light pattern disposed directly on a respective first electrode is substantially isolated from each of the other light patterns; and
a single second electrode formed on substantially an entire face of the substrate, the single second electrode disposed on the light emitting patterns and directly on the insulation member,
wherein a width of the groove is equal to or more than a width of the openings.

12. The display device of the claim 11, wherein the insulation member comprises an organic material, an inorganic material or a photoresist material.

13. The display device of the claim 11, wherein a plurality of dummy light emitting patterns are formed on the substrate corresponding to the groove, and an insulation layer is formed corresponding to the second region of the substrate.

14. A display device comprising:
a substrate comprising a first region and a second region surrounding the first region;
a plurality of first electrodes disposed in the first region;
an insulation film, formed on the substrate to cover the first electrodes, comprising a plurality of first and second openings, the first openings exposing a portion corresponding to each of the first electrodes, the second openings disposed in the second region;
light emitting patterns disposed directly on the first electrodes, the light emitting patterns filling up the first openings, respectively;
a plurality of dummy light emitting patterns directly formed on the substrate in the second region; and
a single second electrode formed on substantially an entire face of the substrate, the single second electrode disposed on the light emitting patterns and directly on the insulation member.

15. The display device of the claim 14, wherein a first width of the first openings is equal to or less than a second width of the second openings.

16. A method of manufacturing a display device comprising:
forming a plurality of first electrodes in a first region formed on a substrate;
forming an insulation member on the first region, wherein the insulation member comprises a plurality of openings each exposing a portion corresponding to each of the first electrodes;
forming light emitting patterns directly on the first electrodes and a plurality of dummy light emitting patterns directly formed on the substrate in the second region; and
forming a single second electrode formed on substantially an entire face of the substrate, the single second electrode formed in the first region to cover the light emitting patterns and directly on the insulation member.

17. The method of the claim 16, wherein a conductive layer comprising a transparent conductive material is formed on the substrate and the conductive material is patterned to form the first electrodes in the first region.

18. The method of the claim 17, wherein the first electrodes comprise an indium tin oxide (ITO) material or an indium zinc oxide (IZO) material.

19. The method of the claim 17, wherein the openings comprise a rectangular shape, the openings comprise a pair of long sides to face each other and a pair of short sides to face each other, and the long sides are disposed in a first direction and the short sides are disposed in a second direction substantially perpendicular to the first direction, and the openings are disposed in a matrix shape.

20. The method of the claim 16, wherein the insulation member is formed by:
forming an insulation layer on the first and second regions; and
patterning the insulation layer to expose the first electrode in the first region and to remove portions of the insulation layer in the second region.

21. The method of the claim 20, wherein the openings are essentially disposed on the center of the first electrodes.

22. The method of the claim 20, wherein an edge portion of the insulation member extends from the first region to the second region so that the openings continue into the second region and comprise substantially a same interval as an interval between the openings of the first region.

23. The method of the claim 16, wherein a hole injection material as a droplet shape is dropped on the first electrode so as to form a hole injection layer of the light emitting patterns and a light emitting material as a droplet shape is dropped on the hole injection layer so as to form a light emitting layer of the light emitting patterns.

* * * * *